(12) United States Patent
Hourai et al.

(10) Patent No.: US 11,078,595 B2
(45) Date of Patent: Aug. 3, 2021

(54) METHOD OF PRODUCING SILICON SINGLE CRYSTAL INGOT AND SILICON SINGLE CRYSTAL INGOT

(71) Applicant: SUMCO CORPORATION, Tokyo (JP)

(72) Inventors: Masataka Hourai, Tokyo (JP); Wataru Sugimura, Tokyo (JP); Toshiaki Ono, Tokyo (JP); Toshiyuki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 109 days.

(21) Appl. No.: 16/477,003

(22) PCT Filed: Jan. 11, 2018

(86) PCT No.: PCT/JP2018/000514
§ 371 (c)(1),
(2) Date: Jul. 10, 2019

(87) PCT Pub. No.: WO2018/159108
PCT Pub. Date: Sep. 7, 2018

(65) Prior Publication Data
US 2019/0352796 A1 Nov. 21, 2019

(30) Foreign Application Priority Data

Feb. 28, 2017 (JP) .............................. JP2017-037618

(51) Int. Cl.
*C30B 15/20* (2006.01)
*C01B 33/02* (2006.01)
*C30B 29/06* (2006.01)

(52) U.S. Cl.
CPC .............. *C30B 15/20* (2013.01); *C01B 33/02* (2013.01); *C30B 29/06* (2013.01);
(Continued)

(58) Field of Classification Search
CPC .. C01B 33/02; C01P 2002/54; C01P 2002/60; C01P 2006/40; C30B 15/20; C30B 29/06
See application file for complete search history.

(56) References Cited

U.S. PATENT DOCUMENTS 5,129,986 A * 7/1992 Seki .................... C30B 15/00
                117/202
5,524,574 A * 6/1996 Huang .................. C30B 15/206
                117/20

(Continued)

FOREIGN PATENT DOCUMENTS

| JP | 61-227986 | 10/1986 |
| JP | 62-113789 | 5/1987 |

(Continued)

OTHER PUBLICATIONS

Notice of Reasons for Refusal (Office Action) for Japanese Patent Application No. 2019-502487, dated Jan. 14, 2020; and English-language translation thereof.

(Continued)

*Primary Examiner* — Mark Kopec
*Assistant Examiner* — Jaison P Thomas
(74) *Attorney, Agent, or Firm* — Greenblum & Bernstein, P.L.C.

(57) ABSTRACT

Provided is a method of producing a high resistance n-type silicon single crystal ingot with small tolerance margin on resistivity in the crystal growth direction, which is suitably used in a power device. In the method of producing a silicon single crystal ingot using Sb or As as an n-type dopant, while a silicon single crystal ingot is pulled up, the amount of the n-type dopant being evaporated from a silicon melt per unit solidification ratio is kept within a target evaporation amount range per unit solidification ratio by controlling one or more pulling condition values including at least one of the (Continued)

pressure in a chamber, the flow volume of Ar gas, and a gap between a guide portion and the silicon melt.

10 Claims, 12 Drawing Sheets

(52) U.S. Cl.
CPC ...... *C01P 2002/54* (2013.01); *C01P 2002/60* (2013.01); *C01P 2006/40* (2013.01)

(56) References Cited

U.S. PATENT DOCUMENTS

| | | | |
|---|---|---|---|
| 6,019,837 A * | 2/2000 | Maeda | C30B 15/20 117/14 |
| 7,070,649 B2 * | 7/2006 | Weber | C30B 15/00 117/13 |
| 8,852,340 B2 | 10/2014 | Narushima et al. | |
| 9,938,634 B2 * | 4/2018 | Sakurada | C30B 30/04 |
| 10,487,418 B2 * | 11/2019 | Daggolu | C30B 29/06 |
| 2004/0083947 A1 * | 5/2004 | Weber | C30B 29/06 117/19 |
| 2008/0078322 A1 * | 4/2008 | Kawazoe | C30B 15/14 117/217 |
| 2009/0314996 A1 * | 12/2009 | Kawazoe | C30B 15/04 252/500 |
| 2010/0071612 A1 * | 3/2010 | Narushima | C30B 15/20 117/21 |
| 2010/0212580 A1 * | 8/2010 | Kawazoe | C30B 15/20 117/19 |
| 2011/0049438 A1 * | 3/2011 | Kawazone | C30B 15/00 252/512 |
| 2011/0259260 A1 * | 10/2011 | Takanashi | C30B 35/00 117/15 |
| 2012/0056135 A1 * | 3/2012 | DeLuca | C30B 15/002 252/512 |
| 2015/0333193 A1 * | 11/2015 | Appel | H01L 31/0288 136/256 |
| 2018/0087179 A1 * | 3/2018 | Zepeda | C30B 15/12 |
| 2018/0291524 A1 * | 10/2018 | Basak | C30B 15/20 |

FOREIGN PATENT DOCUMENTS

| | | |
|---|---|---|
| JP | 02-116695 | 5/1990 |
| JP | 2008-280211 | 11/2008 |
| JP | 2010-006646 | 1/2010 |
| JP | 2010-059032 | 3/2010 |
| JP | 2010059032 A * | 3/2010 |
| JP | 2012-031023 | 2/2012 |
| JP | 2012-206874 | 10/2012 |

OTHER PUBLICATIONS

International Search Report issued in International Patent Application No. PCT/JP2018/000514, dated Apr. 3, 2018.
International Preliminary Report on Patentability issued in International Patent Application No. PCT/JP2018/000514, dated Sep. 3, 2019.
Office Action for CN App. No. 201880014539.9, dated Jan. 26, 2021 (w/ translation).
Office Action for KR App. No. 10-2019-7024912, dated Sep. 14, 2020 (w/translation).
Office Action for CN App. No. 201880014539.9, dated Dec. 9, 2020 (w/ translation).

* cited by examiner

METHOD OF PRODUCING SILICON SINGLE CRYSTAL INGOT AND SILICON SINGLE CRYSTAL INGOT

TECHNICAL FIELD

This disclosure relates to a method of producing a silicon single crystal ingot and a silicon single crystal ingot. In particular, this disclosure relates to a method of producing an n-type silicon single crystal ingot using Sb (antimony) or As (arsenic) as an n-type dopant, which ingot is suitably used to produce an n-type silicon wafer for insulated-gate bipolar transistors (IGBTs) and to a silicon single crystal ingot produced by the method.

BACKGROUND

A silicon wafer used as a substrate of a semiconductor device is produced by cutting a silicon single crystal ingot into thin slices and subjecting the slices to a surface grinding (lapping) step, an etching step, and a mirror polishing (polishing) step followed by final washing. A silicon single crystal having a large diameter of 300 mm or more is typically produced by the Czochralski (CZ) process. A silicon single crystal-pulling furnace using the CZ process is also called a CZ furnace.

Of semiconductor devices, insulated-gate bipolar transistors (IGBTs) which are a type of power device are gate voltage driven switching devices suitable for high power control, and find use in electric trains, power supply, and vehicle-mounted applications, etc. In power device applications, such as IGBTs, n-type silicon wafers are used under the current circumstances, which are obtained by slicing an n-type silicon single crystal ingot with a diameter of 200 mm doped with P (phosphorus), which is produced by the floating zone melting (FZ) process and the MCZ (Magnetic field applied Czochralski) process.

Here, for a silicon single crystal ingot grown by the FZ process, a silicon melt serving as a silicon feedstock is continuously supplied. Further, in the case of using the gas doped FZ process, a dopant gas is also continuously and quantitatively blown and supplied to the vicinity of a melt holder. In either case, uniform resistivity can be obtained across almost the entire straight trunk of the ingot. Accordingly, almost the whole straight trunk of a silicon single crystal ingot grown by the FZ process as illustrated in FIG. 1 can be used as a product. However, since the FZ crystal growing process is a very difficult technique and the most typical diameter of silicon single crystal ingots that can be stably produced by the FZ process has been 150 mm, and it is only recently being replaced by a diameter of 200 mm. In particular, producing silicon single crystal ingots having a large diameter of 300 mm by the FZ process is considered very difficult.

On the other hand, P is typically used as a dopant practically used in n-type silicon single crystal ingots for power devices using the CZ process or the MCZ process. The yield of n-type silicon wafers obtained from such a silicon single crystal ingot doped with P that meet the specifications including for example a resistivity of 50 [Ω·cm]±10%, is approximately 10% at most in the current circumstances (see FIG. 1). This is because since P has a segregation coefficient of less than 1, the P concentration (n-type dopant concentration) in the melt increase as the pulling of silicon single crystal proceeds, and the resistance gradually decreases. Since P has a segregation coefficient of 0.35, which is significantly higher than the segregation coefficient of B (boron) of 0.8, in the case of growing a crystal having resistance in a target range across the entire crystal length, the yield of n-type silicon single crystal ingots would be lower than the yield of p-type silicon single crystal ingots. Hence, techniques for improving the yield of n-type silicon single crystal ingots have been diligently studied.

From the studies, it has been proposed that Sb (antimony) or As (arsenic) of which evaporation rate [atoms/s] is significantly higher than that of P is used as an n-type dopant although its segregation coefficient is even smaller than that of P. Tolerance margin on average resistivity of a silicon single crystal ingot can be reduced by reducing the pressure inside a chamber of a CZ furnace to accelerate evaporation of the n-type dopant and thereby compensating the segregation of the n-type dopant.

On the other hand, we propose a method of producing a silicon wafer for vertical silicon devices by pulling up a silicon single crystal by the Czochralski process according to PTL 1 from a silicon melt to which Sb (antimony) or As (arsenic) is added as a volatile dopant, in which method the flow volume of Ar gas flowing along the surface of the silicon melt is increased with the process of the pulling of the silicon single crystal.

As described in PTL 1, since the surface of the melt has a high concentration of gas containing the volatile dopant having been evaporated, the evaporation rate of the volatile dopant in the silicon melt depends on not only the pressure inside the chamber of the CZ furnace but also greatly on the flow volume of the Ar gas. Accordingly, the evaporation rate of the volatile dopant is controlled by controlling the flow volume of the Ar gas flowing on the melt surface by the technique described in PTL 1, thus segregation of the dopant can be compensated.

CITATION LIST

Patent Literature

PTL 1: JP 2010-059032 A

SUMMARY

Technical Problem

The allowable resistance tolerance margin in a silicon wafer for power devices such as IGBTs is significantly small and has conventionally been ±10% with respect to the average resistivity. In recent years, however, the tolerance margin is required to be approximately ±8%, and a desired tolerance margin is going to be in a range of ±7% or less in the future. Although the technique described in PTL 1 made it possible to control the evaporation rate of an n-type dopant to some extent, there is room for improvement in achieving the tolerance margin to be required in the future at a high yield in the crystal growth direction.

It could therefore be helpful to provide a method of producing a high resistance n-type silicon single crystal ingot with small tolerance margin on average resistivity, which is suitably used in a power device.

Solution to Problem

We made diligent studies to achieve the above objective. In this specification, Sb and As are hereinafter collectively referred to simply as "n-type dopants". The relation between the concentration of an n-type dopant in the silicon melt and the evaporation rate (evaporation amount) is described with reference to FIG. 2.

FIG. 2 depicts a main part of a typical CZ furnace and illustrates a state where a silicon melt 10 is stored in a quartz crucible 21 and a silicon single crystal ingot 1 is pulled up while being heated by a heater 90. In FIG. 2, the quartz crucible 21 has a dual structure in which the quartz crucible is held by a carbon crucible 22. While the silicon single crystal ingot 1 is pulled up, an n-type dopant is added to the silicon single crystal ingot 1 by an amount of $dC_s(f_s)$ per unit solidification ratio, the dopant is left in the silicon melt 10 by an amount of $dC_L(f_s)$ per unit solidification ratio. Further, the dopant evaporates from the silicon melt 10 by an amount of $dC_V$ per unit time. Note that "solidification ratio" herein means a ratio of the mass of the silicon single crystal ingot 1 being pulled up with respect to the feedstock mass (i.e., the mass of the silicon melt 10 before pulling up the ingot).

We contemplated controlling to keep the n-type dopant concentration in the silicon melt ideally constant in order to further reduce tolerance margin of the crystal on resistivity in the growth direction in the growth of an n-type silicon single crystal using the volatile n-type dopant, described in PTL 1. To perform such control, the n-type dopant alone or in chemical combination is required to be evaporated from the melt surface by an amount equivalent to the amount of the n-type dopant being concentrated in the melt by segregation. Accordingly, we first considered keeping a fixed evaporation rate (evaporation amount per unit time) of the n-type dopant while pulling up the crystal. Note that evaporation of the n-type dopant from the melt is considered to be evaporation of the dopant element alone or evaporation of the dopant in the form of antimony oxide ($Sb_xO_y$), arsenic oxide ($As_xO_y$), etc. Such an oxide is formed in the silicon melt by a combination of the feedstock silicon and oxygen having been dissolved from the quartz crucible 21 and is discharged from the silicon melt 10 in the form of gas.

Here, the evaporation rate of the n-type dopant on the melt surface directly depends on the flow rate of Ar gas directly on the melt. This is because the concentration gradient of the Sb compound or As compound in the concentration boundary layer in the vicinity of a gas-liquid interface on the gas-phase side (here, mass transfer is possible only by diffusion) depends on the Ar gas flow rate directly on the concentration boundary layer. Accordingly, as the Ar gas flow rate increases, the concentration gradient of the Sb compound or As compound increases, and the evaporation amount of the Sb compound or As compound evaporated from the melt also increases. Thus, in order to control the evaporation rate of the n-type dopant, that is, the evaporation rate of the Sb compound or As compound, the flow rate of Ar gas directly on the silicon melt is required to be controlled.

In terms of the structure of the CZ furnace, it is difficult to directly regulate the flow volume of Ar itself directly on the silicon melt. Given this factor, the Ar flow rate on the melt surface is indirectly controlled by controlling the pressure in the chamber of the CZ furnace, the flow rate of the Ar gas supplied into the chamber, a gap between a guide portion for the Ar gas and the silicon melt surface (hereinafter referred to as "gap"), etc. Note that since the Ar flow rate is inversely proportional to the chamber pressure, directly proportional to the Ar flow volume, and inversely proportional to the gap, thus these relationships also apply to the evaporation rate of the dopant.

While the crystal is pulled up in the CZ furnace, the pulling rate for the silicon single crystal ingot and the diameter of the silicon single crystal ingot are not consistently fixed and vary with time. Further, the pulling rate for the silicon single crystal ingot is also an operational parameter for controlling the ingot diameter and thus needs to be changed in accordance with changes in the thermal environment in the CZ furnace in the process of the pulling. Consequently, as the crystal growth rate of silicon also changes due to change in the thermal environment, the actual pulling rate also changes. Thus, although the Ar flow rate is kept constant and the evaporation rate of the n-type dopant can be fixed, as the pulling rate changes, time required for the crystal length or the solidification ratio to become constant changes. Accordingly, the amount of the dopant evaporated from the silicon melt per unit solidification ratio also changes, the dopant concentration of the melt changes without being constant, and consequently the concentration of the dopant in the silicon single crystal ingot varies in the crystal growth direction.

Referring back to FIG. 2, considering such change in the pulling rate with time, even if the amount of the n-type dopant such as Sb or As evaporated per unit time $dC_V$ [atoms/s] is controlled to be constant, the concentration of the n-type dopant in the silicon melt 10 cannot be made constant, and the concentration of the dopant in the silicon single crystal ingot 1 cannot be uniform in the crystal growth direction. Therefore, the amount of the n-type dopant evaporated is required to be changed in accordance with the pulling rate.

In view of the above, with respect to the evaporation amount of the n-type dopant, we first contemplated keeping a constant amount of the n-type dopant evaporated per unit solidification ratio [atoms/unit solidification ratio] instead of controlling the evaporation rate [atoms/s] which is the evaporation amount per unit time. When the amount of the dopant evaporated per unit solidification ratio $dC_V(f_s)$ becomes equivalent to the amount of the dopant left in the silicon melt 10 per unit solidification ratio $dC_L(f_s)$, the concentration of the n-type dopant in the silicon melt 10 can be controlled to be constant without depending on temporal variation factors.

Thus, we found that the dopant concentration in the melt can be made constant by controlling to keep a constant evaporation amount per unit solidification ratio [atoms/unit solidification ratio]. This allows the dopant concentration of the silicon single crystal ingot to be also made uniform in the crystal growth direction. Consequently, we found that tolerance margin of the silicon single crystal ingot on the resistivity in the crystal growth direction can be made significantly small as compared with that achieved by the conventional technique. Further, it is also possible to obtain a silicon single crystal ingot with a given resistivity in the crystal growth direction by changing the evaporation amount per unit solidification ratio as desired during crystal pulling. This disclosure completed based on the above findings primarily includes the following features.

(1) A method of producing a silicon single crystal ingot using a silicon crystal-pulling furnace having a crucible storing a silicon melt doped with an n-type dopant made of Sb or As, a chamber accommodating the crucible, a pressure regulator portion controlling a pressure in the chamber, a pulling portion pulling up a silicon single crystal ingot from the silicon melt, a gas supply for supplying Ar gas into the chamber, and a guide portion provided above a surface of the silicon melt for guiding the Ar gas to flow along the surface of the silicon melt, comprising: a pulling step of pulling up the silicon single crystal ingot by the Czochralski process; and an evaporation amount control step of keeping an amount of the n-type dopant being evaporated from the silicon melt per unit solidification ratio within a target evaporation amount range per unit solidification ratio by controlling one or more pulling condition values including at least one of a pressure in the chamber, a flow volume of the Ar gas, and a gap between the guide portion and the silicon melt while performing the pulling step.

(2) The method of producing a silicon single crystal ingot, according to (1) above, wherein the target evaporation amount is uniform in a crystal growth direction.

(3) The method of producing a silicon single crystal ingot, according to (1) or (2) above, further comprising: prior to the pulling step, a step of forming one or more silicon single crystal ingots for evaluation using the silicon single crystal pulling furnace; and a step of determining changes in the amount of the n-type dopant being evaporated per unit solidification ratio in the silicon single crystal pulling furnace, based on changes in a resistivity of the silicon single crystal ingots for evaluation in a crystal growth direction, wherein in the evaporation amount control step, the pulling condition values are increased or decreased based on the determined changes in the evaporation amount.

(4) The method of producing a silicon single crystal ingot, according to (1) or (2) above, further comprising a measurement step of measuring the evaporation amount of the n-type dopant per unit solidification ratio while performing the pulling step, wherein in the evaporation amount control step, the pulling condition values are controlled so that the measured evaporation amount per unit solidification ratio is kept within the target evaporation amount.

(5) The method of producing a silicon single crystal ingot, according to (4) above, wherein in the measurement step, a concentration of the n-type dopant discharged with the Ar gas on the Ar gas outlet side is measured.

(6) The method of producing a silicon single crystal ingot, according to (5) above, wherein in the measurement step, a diameter and a pulling length of the silicon single crystal ingot being pulled up are measured, and the evaporation amount per unit solidification ratio is calculated on the basis of the solidification ratio based on the measurement and the concentration of the n-type dopant contained in the Ar gas.

(7) A silicon single crystal ingot using Sb or As as an n-type dopant, which has a resistivity in a range of 10 Ω·cm or more and 1000 Ω·cm or less and a crystal diameter of 200 mm or more, in which 40% or more of the silicon single crystal ingot has a resistivity in a range of ±7% of a specification resistivity in a crystal growth direction.

Note that the specification resistivity refers to a resistivity set in the production of the single crystal ingot.

Advantageous Effect

This disclosure provides a method of producing a high resistance n-type silicon single crystal ingot with small tolerance margin on resistivity in the crystal growth direction, which is suitably used in a power device.

DETAILED DESCRIPTION

Prior to describing embodiments in detail, first, our Simulation Example 1 which lead to the completion of this disclosure is described.

Simulation Example 1

In this simulation example, a one-dimensional model according to the following formula [1] of a phenomenon in which an n-type dopant segregates while being evaporated was used to study the evaporation rate of the n-type dopant (per unit time) [atoms/s].

$$C_s = keC_0(1-f_s)^{ke-1} - \rho_s \frac{ke}{1-ke}\frac{p}{W_0}\{(1-f_s)^{ke-1} - 1\} \quad [1]$$

Figure 3A:
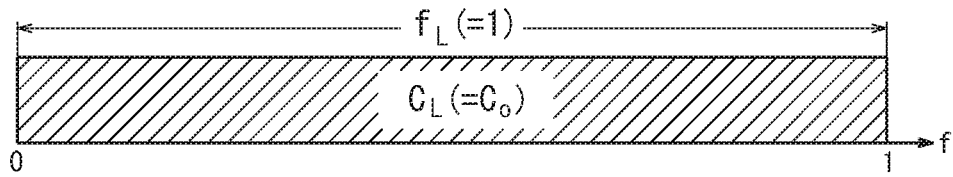
FIG. 3A is a schematic view illustrating a model formula [1] studied in Simulation Example 1.
Figure 3B:
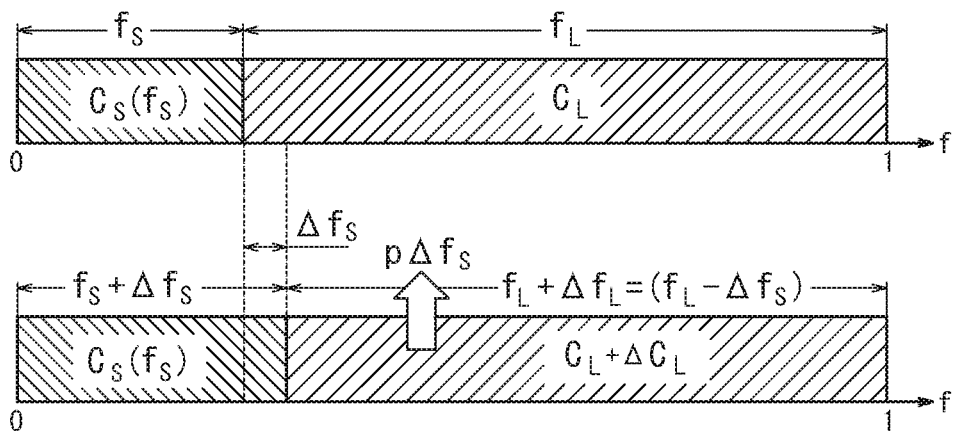
FIG. 3B is a schematic view illustrating a model formula [1] studied in Simulation Example 1.

The one-dimensional model of the above formula [1] is described with reference to FIGS. 3A and 3B. FIGS. 3A and 3B are diagrams illustrating one-dimensional models of impurity segregation in a solidification process (impurities are evaporated to the outside at a constant rate). Considering two phases of a crystal (S) and a melt (L), the weight ratio of the total feedstock ($W_0$[g]) is "1" and the weight fractions of the phases are represented by $f_S$ and $f_L$, respectively. The impurity concentrations in the two phases are represented by $C_S(x)$ and $C_L$ [atoms/cm$^3$]. The distribution of the n-type dopant which is an impurity in the crystal is a function of the solidified phase fraction (solidification ratio), and the dopant is considered to have a uniform concentration in the melt. The concentration of impurities in the melt at the start of solidification ($f_S$=0) is represented by $C_0$ [atoms/cm$^3$] (FIG. 3A). In FIG. 3B, as a crystal growth of $\Delta f_s$ proceeds, impurities are evaporated from the melt by p (p=dQ/df$_s$, p>0, Q is the evaporation amount [atoms]) from the melt is observed. Here, $\rho_s$ is the density of a solid, and ke is the segregation coefficient of the dopant without evaporation.

Under the growth conditions given in Table 1 below, the target resistivity of silicon single crystal ingots was set to 30, 50, 100, 200, 250, 300, and 350 [Ω·cm], and the initial dopant concentration in the melt and the evaporation rate of the dopant were calculated using the above formula [1] so that the target resistivity is uniform in the crystal growth direction. Note that the n-type dopant was Sb, and ke was the segregation coefficient of Sb of 0.023, and $\rho_s$ was the density of Si of 2.33 [g/cm$^3$]. Here, in order to obtain uniform resistivity in the ingot (i.e., dopant concentration), the pulling rate is required to be constant, and the evaporation rate of the dopant is required to be consistently constant to maintain the initial Sb dopant concentration in the melt during crystal growth. The results are given in Table 2 and Table 3 below, and the measured resistivity [Ω·cm] converted from the dopant concentration in the melt, which was obtained when the initial Sb concentration in the melt and the evaporation rate were as given in Table 2 and Table 3 was in close agreement with the target resistivity. Further, when a crystal having a target resistivity is grown at a different pulling rate, set conditions of the initial Sb concentration in the melt and the evaporation rate can be found in the like manner.

TABLE 1

| | |
|---|---|
| Charge amount | 110 kg |
| Diameter | 205 mm |
| Shoulder length | 100 mm |
| Tail length | 140 mm |
| Amount left in crucible | 7.00 kg |
| Pulling rate | 1.00 mm/min |

TABLE 2

| | Target resistivity [Ω · cm] | | | |
|---|---|---|---|---|
| | 30 | 50 | 100 | 200 |
| Initial Sb concentration in melt [atoms/cm$^3$] | 6.63E+15 | 4.10E+15 | 2.00E+15 | 1.00E+15 |
| Sb evaporation rate [atoms/s] | 3.28E+15 | 2.05E+15 | 9.90E+14 | 4.95E+14 |
| Sb concentration in ingot [atoms/cm$^3$] | 1.41E+14 | 8.65E+13 | 4.24E+13 | 2.12E+13 |
| Measured resistivity [Ω · cm] | 30.6 | 49.49 | 100.63 | 200.83 |

TABLE 3

| | Target resistivity [Ω · cm] | | |
|---|---|---|---|
| | 250 | 300 | 350 |
| Initial Sb concentration in melt [atoms/cm$^3$] | 7.97E+14 | 6.63E+14 | 5.67E+14 |
| Sb evaporation rate [atoms/s] | 3.95E+14 | 3.28E+14 | 2.81E+14 |
| Sb concentration in ingot [atoms/cm$^3$] | 1.69E+13 | 1.41E+13 | 1.20E+13 |
| Measured resistivity [Ω · cm] | 251.89 | 302.56 | 353.9 |

Figure 4:
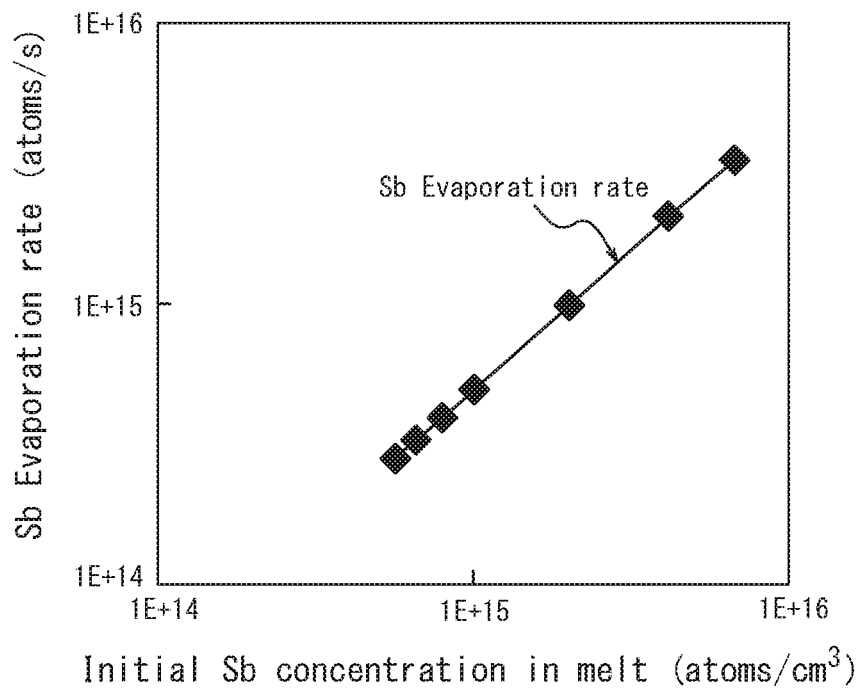
FIG. 4 is a graph illustrating the relationship between the initial Sb concentration in a melt and the Sb evaporation rate in Simulation Example 1.

Note that from Table 2 and Table 3, the relationship between the initial Sb concentration in the melt and the Sb evaporation rate given in FIG. 4 is obtained, and a linear relationship on a logarithmic scale is found. Further, for a different pulling rate, this relationship shifts in parallel.

Test Examples 1, 2

Figure 5A:
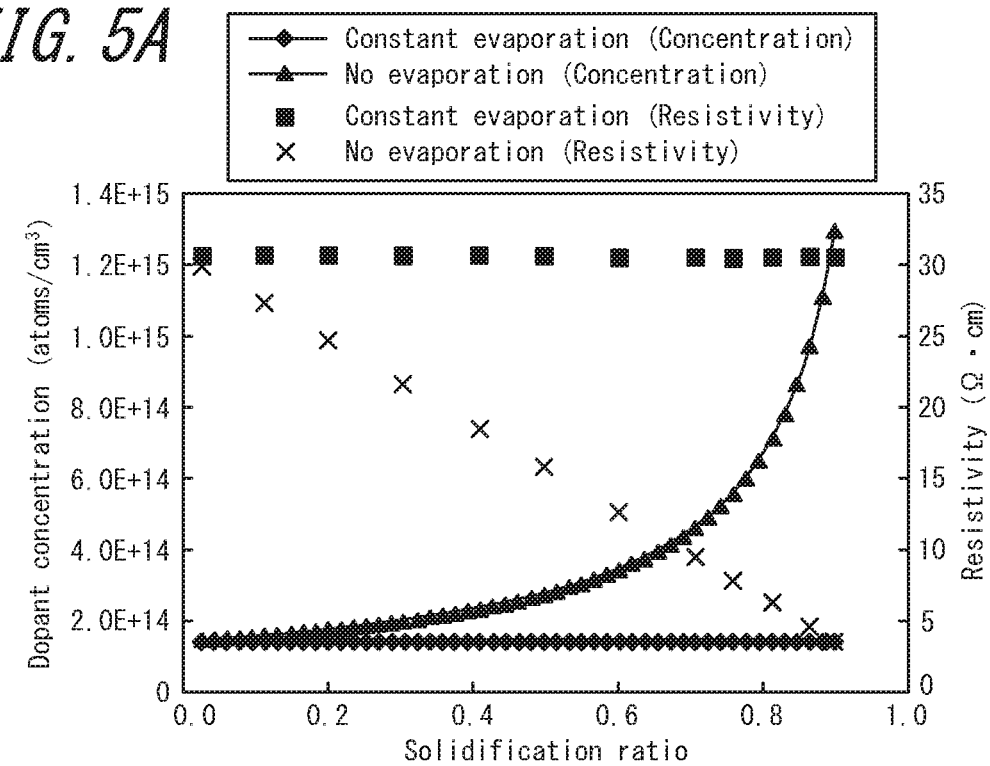
FIG. 5A is a graph illustrating the relationship between the dopant concentration and the resistivity of crystals relative to the solidification ratio in Test Example 1 according to Simulation Example 1.
Figure 5B:
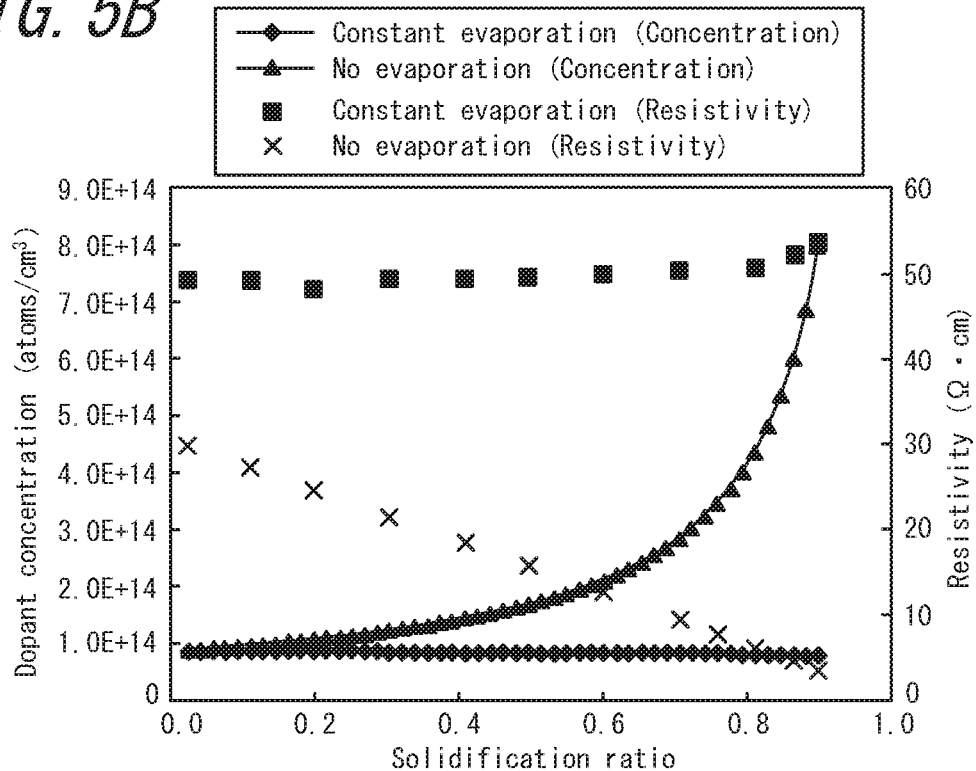
FIG. 5B is a graph illustrating the relationship between the dopant concentration and the resistivity of crystals relative to the solidification ratio in Test Example 2 according to Simulation Example 1.

The pulling rate was fixed to 1.0 [mm/min] as in the above calculation, and the initial Sb concentration in the melt and the Sb evaporation rate were set to the values for a target resistivity of 30 [Ω·cm] (Test Example 1) and a target resistivity of 50 [Ω·cm] (Test Example 2) in Table 2, and the distributions of the dopant concentration and the resistivity in the crystal growth direction in Test Examples 1 and 2 were calculated using the formula [1]. The results of Test Examples 1 and 2 are given in FIGS. 5A and 5B. As presented in FIG. 5A and FIG. 5B, an increase of the dopant in the melt due to segregation and the amount of the dopant compound evaporated from the melt surface agreed, thus the dopant concentration in the melt was kept constant, and the dopant concentration in the crystal and the resistivity were uniform in close agreement with the target resistivity in the crystallographic axis direction. FIGS. 5A and 5B also illustrate the results of cases where no evaporation (that is, only segregation) is assumed to have occurred. As compared with the case where no evaporation occurred, significant difference was observed in the consistency of the dopant concentration and the resistivity. This also applies to FIGS. 6A and 6B described below.

Test Examples 3, 4

Figure 6A:
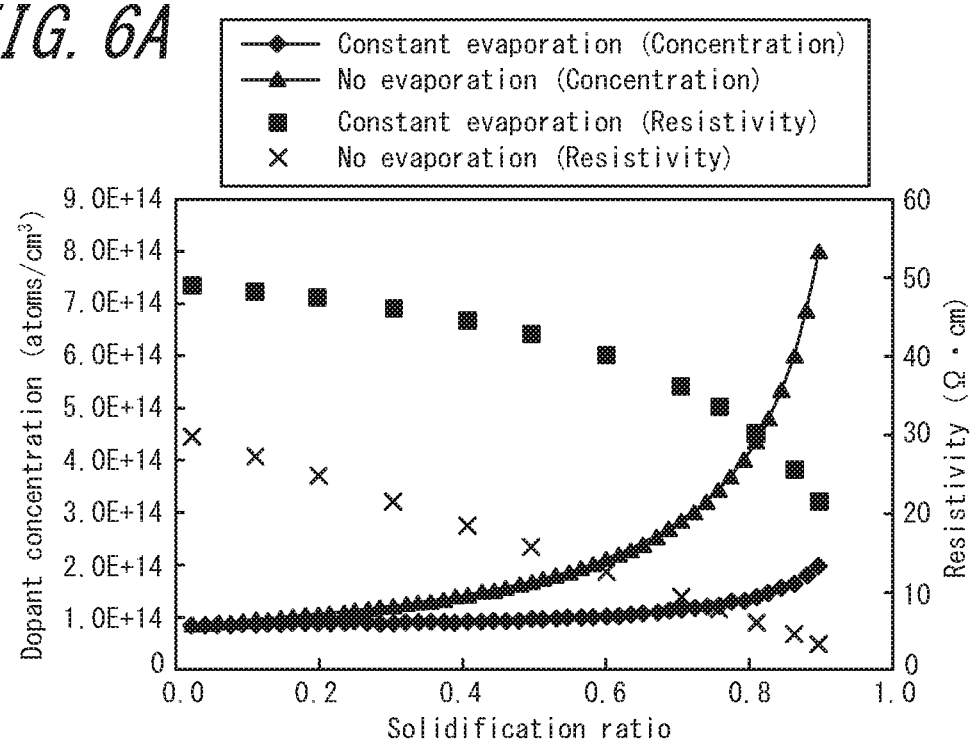
FIG. 6A is a graph illustrating the relationship between the dopant concentration and the resistivity of crystals relative to the solidification ratio in Test Example 3 according to Simulation Example 1.
Figure 6B:
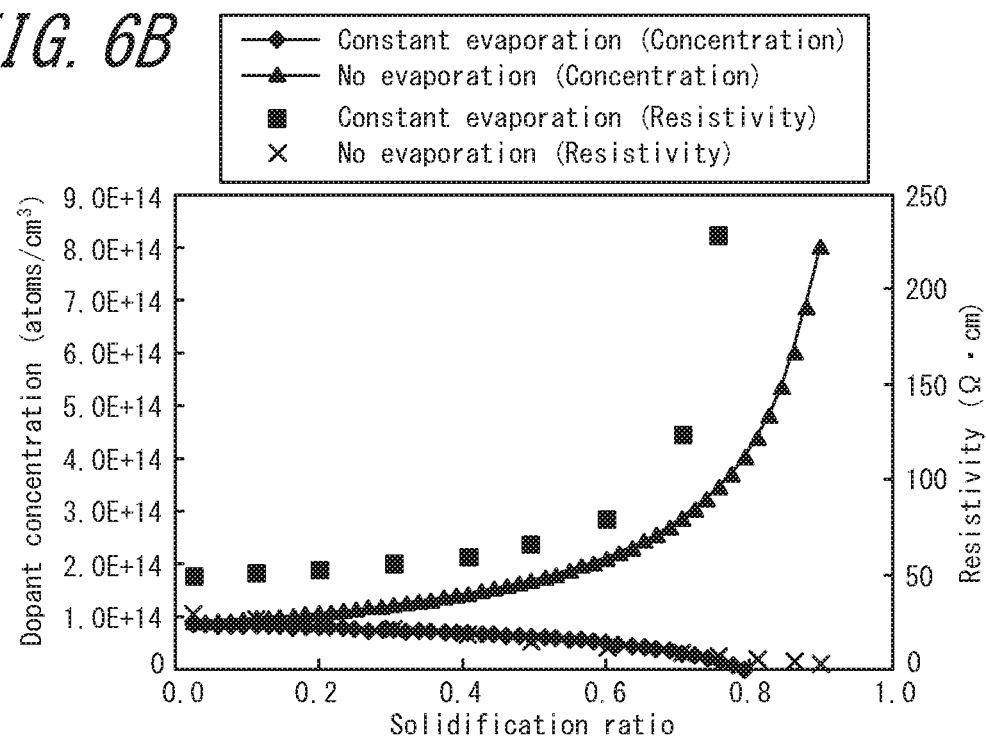
FIG. 6B is a graph illustrating the relationship between the dopant concentration and the resistivity of crystals relative to the solidification ratio in Test Example 4 according to Simulation Example 1.

On the other hand, when the pulling rate was different from those in Table 1; specifically, when the pulling rate was 1.2 [mm/min] (Test Example 3) and 0.8 [mm/min] (Test Example 4), the same values as the initial Sb concentration in melt: $4.1 \times 10^{15}$ [atoms/cm$^3$] and the Sb evaporation rate: $2.05 \times 10^{15}$ [atoms/cm$^3$] that were set conditions for the target resistivity of 50 [Ω·cm] in Table 2 were set and the distributions of the dopant concentration and the resistivity in the crystal growth direction were calculated. The results of Test Examples 3 and 4 are given in FIGS. 6A and 6B. FIGS. 6A and 6B reveal that those pulling rates did not allow the dopant concentration or the resistivity in the crystal growth direction to be uniform. FIGS. 6A and 6B also illustrate the results of cases where no evaporation (that is, only segregation) is assumed to have occurred.

In the case of Test Example 3 (FIG. 6A), even when the initial Sb concentration in the melt and the Sb evaporation rate of the set conditions for the target resistivity of 50 [Ω·cm] in Table 2 agreed, since the pulling rate was high, the increase of the dopant per unit time due to segregation was larger than the dopant evaporation amount per unit time. Accordingly, the Sb concentration in the melt increased as the crystal grew, and the dopant concentration in the ingot also increased.

Further, in the case of Test Example 4 (FIG. 6B), even when the initial Sb concentration in the melt and the Sb evaporation rate of the set conditions for the target resistivity of 50 [Ω·cm] in Table 2 agreed, since the pulling rate was low, the increase of the dopant per unit time due to segregation was smaller than the amount of the dopant evaporated per unit time. Accordingly, the Sb concentration in the melt decreased as the crystal grew, and the dopant concentration in the ingot also decreases.

As in Test Examples 3 and 4, when the pulling rate disagrees with predetermined values, the increase of the dopant being concentrated in the melt per unit time due to segregation varies. On the other hand, the amount of the dopant evaporated from the silicon melt surface per unit time does not change. Accordingly, the increase of the dopant due to the concentration of the dopant and the evaporation amount are unbalanced. Accordingly, the dopant concentration in the melt cannot be kept constant as the crystal grows, and the dopant concentration cannot be kept uniform in the crystal.

Based on the above results, it was found that simply keeping the evaporation rate of the n-type dopant constant was not sufficient, and as described above, the concentration of the n-type dopant in the silicon melt 10 could be controlled to be constant without depending on temporal variation factors, by controlling the evaporation amount of the n-type dopant in accordance with the pulling rate for the ingot. Based on the simulation example results, embodiments of this disclosure will now be described.

(Method of Producing Silicon Single Crystal Ingot)

Figure 7:
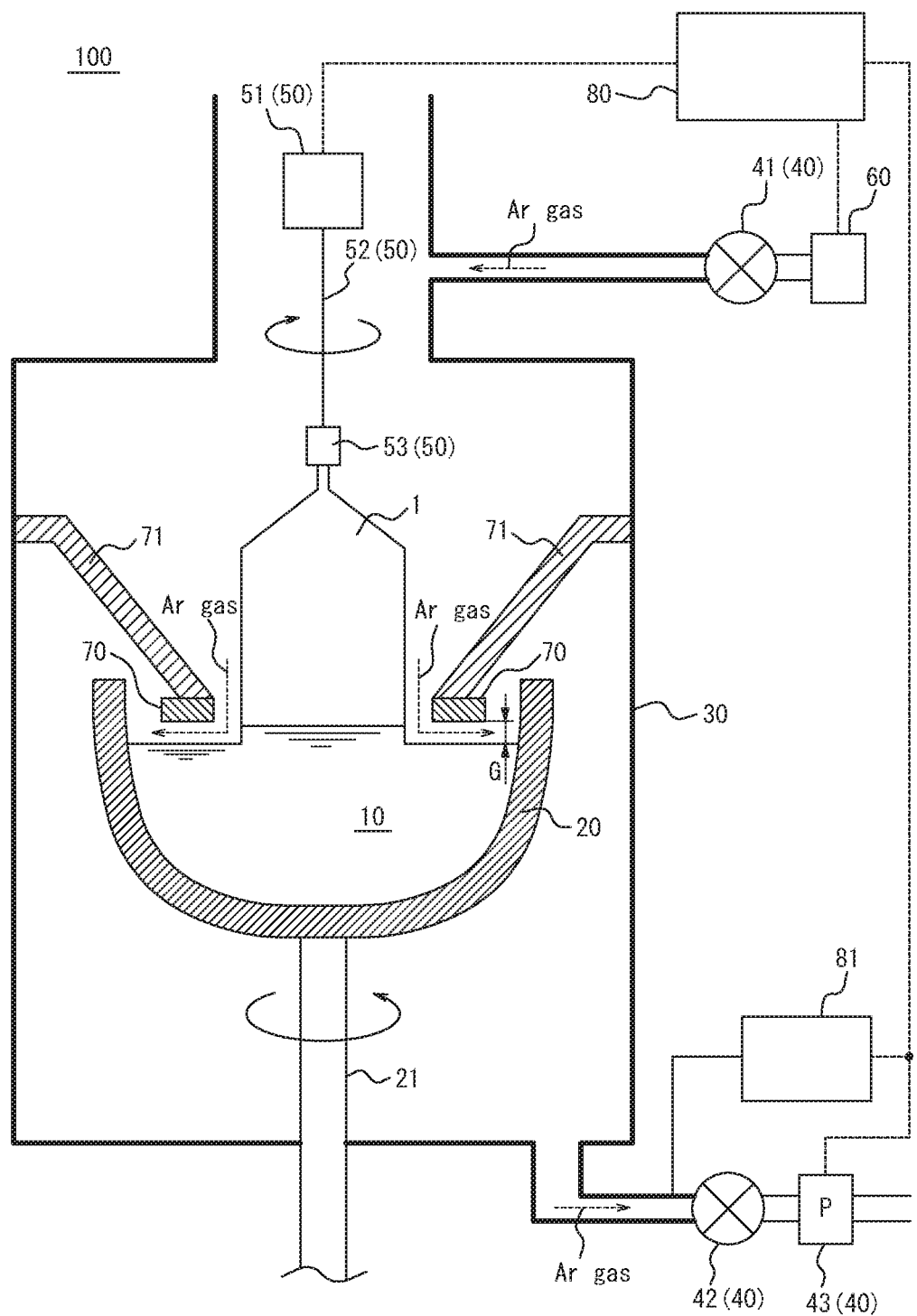
FIG. 7 is a schematic view depicting a silicon single crystal pulling furnace used in one embodiment of this disclosure.

A method of producing a silicon single crystal ingot according to one embodiment of this disclosure can be performed using a silicon single crystal pulling furnace 100 schematically illustrated in FIG. 7. This silicon single crystal pulling furnace 100 has a crucible 20 storing a silicon melt 10, a chamber 30 accommodating the crucible 20, a pressure regulator portion 40 controlling the pressure in the chamber 30 (hereinafter "furnace pressure"), a pulling portion 50 pulling up a silicon single crystal ingot 1 (hereinafter abbreviated as "ingot 1") from the silicon melt 10, a gas supply 60 for supplying Ar gas into the chamber 30, a guide portion 70 provided above the surface of the silicon melt 10 for guiding the Ar gas to flow along the surface of the silicon melt 10, and optionally other components. Here, in the silicon single crystal pulling furnace 100, the silicon melt 10 is doped with an n-type dopant made of Sb or As (hereinafter simply abbreviated as "n-type dopant").

The production method of this embodiment includes a pulling step of pulling up the silicon single crystal ingot 1 by the Czochralski process; and an evaporation amount control step of keeping the amount of the n-type dopant being evaporated from the silicon melt 10 per unit solidification ratio within a target evaporation amount range per unit solidification ratio by controlling, while performing the pulling step, one or more pulling condition values including at least one of the pressure in the chamber 30 (i.e., furnace pressure), the flow volume of Ar gas, and a gap G between the guide portion 70 and the silicon melt 10 (hereinafter abbreviated as "gap").

The pulling step can be performed by a conventionally known technique using the CZ process. In this embodiment, a characteristic step is the evaporation amount control step of, while performing the pulling step, keeping the evaporation amount of the n-type dopant per unit solidification ratio [atoms/unit solidification ratio] within a target evaporation amount range in accordance with the pulling of the ingot 1. Note that "keeping the evaporation amount per unit solidification ratio within the range of the target evaporation amount per unit solidification ratio" in the evaporation amount control step does not mean to keep the evaporation amount to a fixed amount in a mathematical sense but means to control one or more pulling condition values to keep the evaporation amount within a desired evaporation amount range. For example, when the target evaporation amount is a desired evaporation amount A per unit solidification ratio [atoms/unit solidification ratio], controlling to keep changes in the evaporation amount within a range of A±10% is included in "keeping the evaporation amount per unit solidification ratio within the range of the target evaporation amount per unit solidification ratio", and changes in the evaporation amount are preferably controlled to be kept within a range of A±8%, more preferably changes in the evaporation amount are controlled to be kept within a range of A±7%.

The target evaporation amount per unit solidification ratio is preferably uniform in the crystal growth direction. This is because the resistivity can be almost uniform over the entire area in the crystal growth direction. However, the target evaporation amount per unit solidification ratio may be gradually increased or decreased depending on the length of the crystal being pulled up; alternatively, the target evaporation amount per unit solidification ratio may be increased or decreased depending on crystal length brackets. Thus, a single crystal silicon ingot having a given resistivity in the crystal growth direction can be obtained.

The evaporation amount control step can be mainly performed by the following two methods. In the first method, the correspondence between the evaporation amount of the n-type dopant per unit solidification ratio and the pulling condition values is previously determined, and the correspondence is applied to pulling in the next and following batches. This first method is hereinafter referred to as "inter-batch control method". The second method is a method in which the evaporation amount of the n-type dopant per unit solidification ratio is measured in-situ while the crystal is pulled up, and the evaporation amount is controlled during one pulling operation. This second method is hereinafter referred to as "in-situ control method".

<Inter-Batch Control Method>

When the inter-batch control method is applied to this embodiment, the method preferably further includes, prior to the pulling step, forming one or more silicon single crystal ingots for evaluation using the silicon single crystal pulling furnace 100; and determining changes in the amount of the n-type dopant evaporated per unit solidification ratio in the silicon single crystal pulling furnace 100 based on changes in the resistivity of the silicon single crystal ingots for evaluation in the crystal growth direction. In the evaporation amount control step, the pulling condition values are preferably increased or decreased based on the thus determined changes in the evaporation amount. These steps will be described in detail below.

In the step of forming the silicon single crystal ingots for evaluation, using a program for setting the pulling rate in the pulling step, at least one of condition values of the furnace pressure, the flow volume of Ar gas, and the gap G is controlled to form silicon single crystal ingots for evaluation (hereinafter, "evaluation ingots").

Next, the thus formed evaluation ingots are analyzed in the crystal growth direction, and changes in the dopant concentration or the resistivity in the crystal growth direction is determined as a function of the solidification ratio. From the changes, changes in the evaporation amount of the n-type dopant per unit solidification ratio in the silicon single crystal pulling furnace 100 (i.e., the evaporation amount as a function of the solidification ratio) can be calculated, thus the condition values including the furnace pressure, the flow volume of Ar gas, and the gap G in preparing the evaluation ingots are found to have an effect on the evaporation amount per unit solidification ratio.

As described above, the Ar flow rate is inversely proportional to the furnace pressure, directly proportional to the Ar flow volume, and inversely proportional to the gap. The condition values in pulling may be changed in accordance with the solidification ratio so that the evaporation amount is increased, decreased, or maintained to keep the evaporation amount of the dopant within a range of the target evaporation amount in accordance with the solidification ratio of the evaluation ingots.

Specifically, when the evaporation amount of the dopant is increased, one or more of reducing the furnace pressure, increasing the Ar flow volume, and reducing the gap G may be performed. Note that all those three control factors are not necessarily controlled to promote evaporation; for example, the adjustment may be performed by, while increasing the Ar flow rate, increasing the furnace pressure for fine adjustment, and increasing or reducing the gap G.

Conversely, when the evaporation amount of the dopant is decreased, one or more of increasing the furnace pressure, decreasing the Ar flow volume, and increasing the gap G may be performed. Further, those three control factors are not necessarily controlled to suppress evaporation; for example, the adjustment may be performed by, while reducing the Ar flow rate, reducing the furnace pressure for fine adjustment, and increasing or reducing the gap G.

Further, if the evaporation amount of the dopant is fixed at a point of time with a predetermined timing in accordance with the solidification ratio of the evaluation ingots, the above condition values may be maintained at the point of time. In the evaporation amount control step, the condition values are optimized, and the ingot 1 is pulled up in the pulling step using the condition values having been improved from the condition values for test ingots.

Preferably, a plurality of evaluation ingots are formed with different condition values, and the pulling condition values are increased or decreased based on the thus determined changes in the evaporation amount in the evaporation amount control step based on the plurality of the evaluation ingots. The evaporation amount of the n-type dopant being evaporated per unit solidification ratio can be controlled to be kept within the target evaporation amount range with higher accuracy.

Further, the evaporation amount of the n-type dopant per unit solidification ratio can also be controlled in the following manner. In this case, evaluation ingots may be actually formed, or parameters may be determined by numeric calculation.

Figure 9:
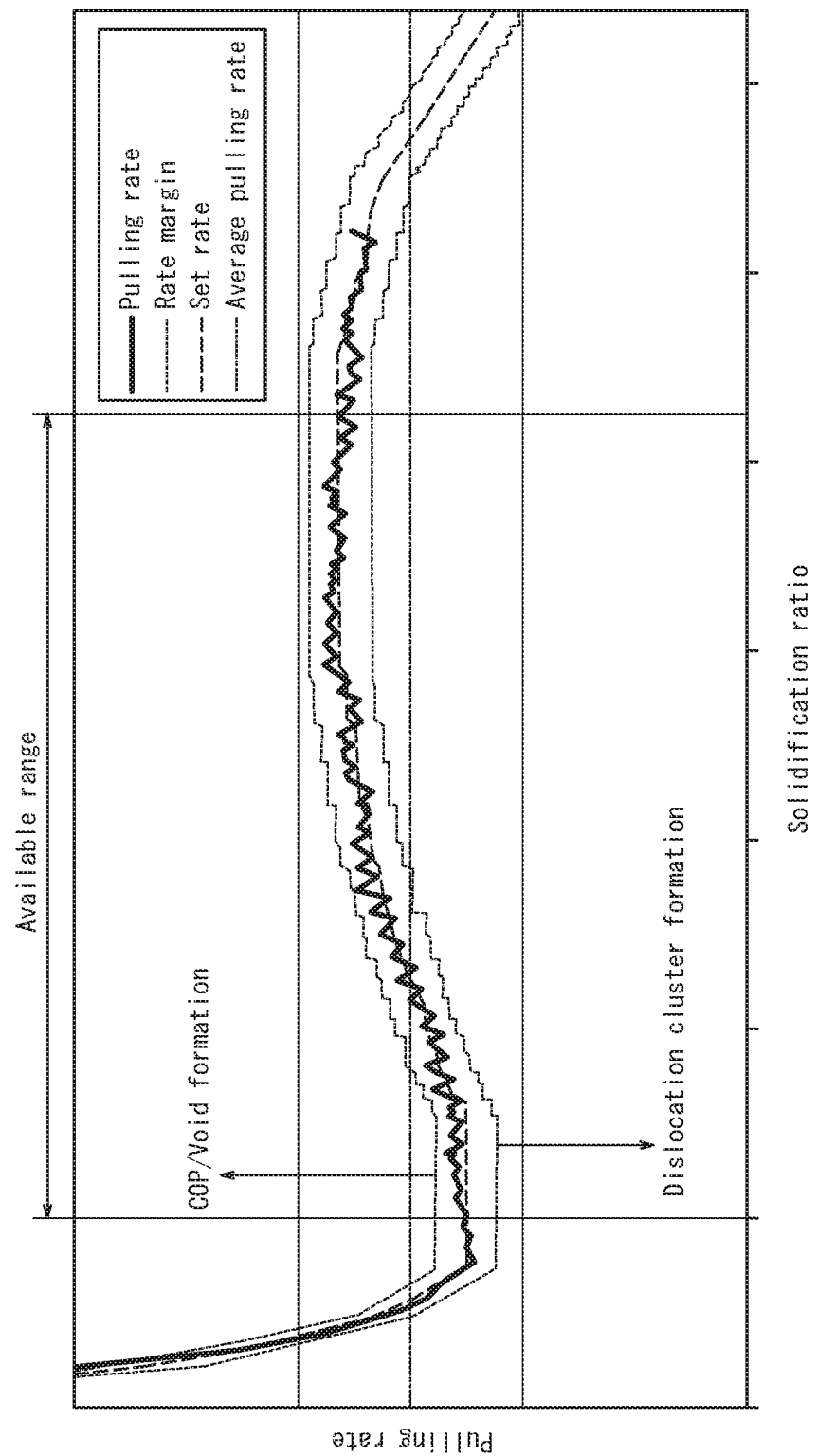
FIG. 9 is a schematic view illustrating changes in the set (programmed) rate and the rate margin of pulling rate, and changes in the measured pulling rate with time after pulling in Example.

<1> First, a plurality of evaluation ingots are grown by fixing the pulling rate to the average puling rate of a subject crystal seed (or a neighboring value), fixing the Ar flow volume and the gap G to standard values for the CZ furnace to be used, and changing the furnace pressure as illustrated in FIG. 9.

<2> The resistivity $C_S(f_s)$ of each evaluation ingot in the crystal growth direction is measured ($f_s$ is the solidification ratio).

<3> The dopant concentration $C_L(f_s)$ in the silicon melt 10 is found from the relation of segregation ($C_S(f_s)=k_0 C_L(f_s)$), $k_0$: the segregation coefficient of the case where no evaporation occurs).

<4> Further, the evaporation amount $dC_V(f_s)$ per unit solidification ratio is determined from the difference between the dopant concentration in the melt without evaporation: $C_L^0(f_s)=C_0(1-f_s)^{ke-1}$ where the initial dopant concentration in the melt is $C_0$ and $C_L(f_s)$ found in <3> above.

<5> The evaporation amount $dC_V(f_s)$ per unit solidification ratio is averaged, and the relation between the average evaporation amount per unit solidification ratio and the furnace pressure is determined.

<6> In a similar manner, a plurality of evaluation ingots are grown by fixing the pulling rate to the average puling rate of a subject crystal seed (or a neighboring value), fixing the furnace pressure and the gap G to standard values for the CZ furnace to be used, and changing the Ar flow volume as illustrated in FIG. 9. Further, the procedures of <2> to <5> are performed to determine the relation between the average evaporation amount per unit solidification ratio and the Ar flow volume.

<7> In a similar manner, a plurality of crystals are grown by fixing the pulling rate to the average puling rate of a subject crystal seed (or a neighboring value), fixing the furnace pressure and the Ar flow volume to standard values for the CZ furnace to be used, and changing the gap G as illustrated in FIG. 9. Further, the procedures of <2> to <5> are performed to determine the relation between the average evaporation amount per unit solidification ratio and the gap G.

<8> Using the above relationship between the average evaporation amount per unit solidification ratio and the furnace pressure, a program for the furnace pressure as a function of the solidification ratio is set, which program corresponds to a program for the pulling rate as a function of the solidification ratio of the ingot 1 to be pulled is set.

<9> The pulling rate program and the furnace pressure program set in <8> above are used to perform pulling of the ingot 1 to be pulled.

<10> When the thus prepared ingot 1 has a resistivity disagreeing with the desired resistivity, this ingot 1 is used as an evaluation ingot. The ingot 1 is pulled up under the conditions where a more accurate program for pulling with respect to the pressure, the Ar flow volume, and the gap is set using the furnace pressure as a main operational parameter and using the Ar flow volume or the gap G as an operational parameter for fine adjustment.

<In-Situ Control Method>

The in-situ control method is also preferably used instead of the inter-batch control method. In principle, the evaporation amount of the n-type dopant can more reliably be controlled to be kept within the target evaporation amount range.

When the in-situ control method is applied to this embodiment, the method further includes a measurement step of, while performing the pulling step, measuring the evaporation amount of the n-type dopant per unit solidification ratio, and in the evaporation amount control step, the pulling condition values are preferably adjusted so that the measured evaporation amount per unit solidification ratio is maintained within the target evaporation amount range.

Here, in the above measurement step, it is preferred to measure the concentration of the n-type dopant discharged with the Ar gas on the Ar gas outlet side.

In order to perform such a measurement step, a measurement unit 81 for measurement using for example infrared spectroscopy or mass spectrometry is provided on the Ar gas outlet side of the silicon single crystal pulling furnace 100, and gas analysis of the n-type dopant discharged with the Ar gas can be performed using the measurement unit 81. As the measurement unit 81, for example, a quadrupole mass spectrometer (QMS) can be used. When the n-type dopant is Sb, Sb is contained as elemental Sb or in the form of SbO, $Sb_2O_3$, etc. in the Ar gas, so that the gas concentration of SbO may be analyzed. For example, when the gas concentration of SbO from an initial stage of the growth of the ingot 1 is constant, the evaporation amount per unit solidification ratio can also be kept constant. To control the evaporation amount of the n-type dopant, one or more pulling condition values may be controlled as described above with respect to the inter-batch control method.

Further, in the above measurement step, the diameter and the pulling length of the ingot 1 being pulled up are measured, and the evaporation amount per unit solidification ratio is preferably measured based on the solidification ratio on the basis of the foregoing measurement and the concentration of the n-type dopant contained in the Ar gas. Note that the diameter of the ingot 1 being pulled up can be measured by measuring the diameter during the growth using a CCD camera for measuring diameter, which is not shown in FIG. 7, and the pulling length thereof can be measured by measuring the winding length of a wire 52 corresponding to the pulling length using a control unit 80. Thus, the evaporation amount can be controlled more precisely depending on the solidification ratio during growth.

Figure 8:
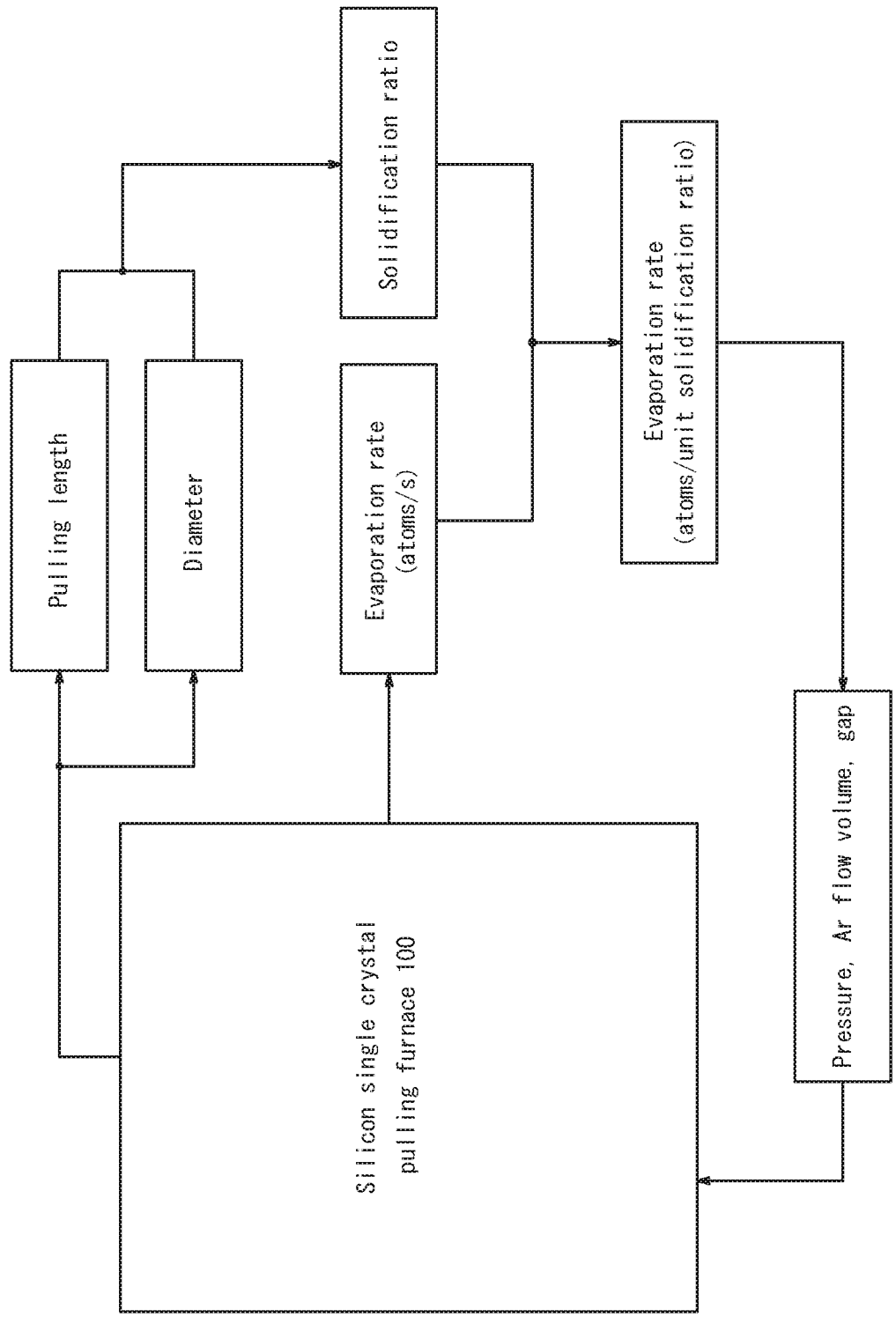
FIG. 8 is a schematic view illustrating a technique of controlling the evaporation amount in-situ in a preferred embodiment of this disclosure.

A preferred measurement step of this embodiment is described with reference to the schematic view of FIG. 8. From the silicon single crystal pulling furnace 100 during crystal growth, the diameter and the pulling length of the ingot 1 are measured, thus the solidification ratio at the time of pulling and the rate of change the solidification ratio are determined. Using the measurement unit 81 described above, the amount of the n-type dopant evaporated in the silicon single crystal pulling furnace 100 per unit time (evaporation rate) or an equivalent value can be measured. The evaporation amount of the n-type dopant per unit solidification ratio can be evaluated in-situ from the solidification ratio and the evaporation rate of the n-type dopant that have been measured. Accordingly, when the evaporation amount of the n-type dopant per unit solidification ratio evaluated in-situ is likely to go out of the target evaporation amount range, the evaporation amount may be controlled by adjusting any of the furnace pressure, the Ar flow volume, and the gap G to compensate the difference.

It is also preferred to perform a method of producing a silicon single crystal ingot according to this embodiment by combining the inter-batch control method and the in-situ control method.

According to this embodiment, controlling evaporation of the Sb compound or the As compound can improve the resistance yield in the crystallographic axis direction of the n-type silicon single crystal ingot 1, and besides, the crystal cost can be reduced. The evaporation of a compound of a volatile n-type dopant such as Sb or As is actively promoted, which increases the Ar flow rate on the surface of the silicon melt 10; accordingly, carbon contamination (caused when CO gas produced by a reaction between a carbon member of a heater etc. and SiO volatilized from the melt flows back to the melt, resulting in redissolution and buildup of the CO gas in the melt) is expected to be reduced.

Note that this embodiment can be applied to cases where the n-type dopant is either Sb or As, yet is more effectively applied to the case where Sb is used. This is because the evaporation rate of Sb is significantly higher than that of As.

Specific aspects of the features of the silicon single crystal pulling furnace 100 are described below; however, this disclosure is not limited to those aspects in any way.

The silicon melt 10 is a feedstock of the silicon single crystal ingot 1. The feedstock is typically polysilicon, and the feedstock is melted by for example the hear 90 provided on the circumference of the crucible 20 to maintain the state of the melt. Nitrogen may be added to the silicon melt in addition to the n-type dopant.

The crucible 20 stores the silicon melt 10 and may have a dual structure typically including an inner quartz crucible and an outer carbon crucible. A lifting and rotating mechanism 21 can be provided on the lower end of the crucible 20.

The lifting and rotating mechanism 21 can perform lifting and rotation and perform control of the gap G with the use of the control unit 80. The direction of rotation of the lifting and rotating mechanism 21 is typically rotated in the reverse direction to the rotation direction of the pulling portion 50.

An Ar gas outlet can be provided on the bottom of the chamber 30, and an Ar gas supply can be provided above the chamber. Although FIG. 7 illustrates this aspect, the arrangement of the components is not limited to the arrangement in the diagram. Ar gas can be supplied through the valve 41 and discharged through the valve 42. The valves 41 and 42 and a vacuum pump 43 serve as pressure regulator portions 40 in this embodiment. A supply source of Ar gas can be placed upstream of the valve 41, and the supply source serves as the gas supply 60.

The pulling portion 50 may have a wire winding mechanism 51, a pulling wire 52 wound by the wire winding mechanism 51, and a seed chuck 53 for retaining the seed crystal.

The guide portion 70 may be constituted by the end portion of a heat shielding member 71 in the silicon single crystal pulling furnace 100 on the silicon melt 10 side, or may preferably be provided as a guide plate on the end portion. The guide plate helps to guide the Ar gas to the outside along the surface of the silicon melt 10, which makes it easier to control the flow rate. In this case, the gap is a gap between the melt surface and the guide plate. The heat shielding member 71 prevents heating of the silicon ingot 1 and suppresses changes in the temperature of the silicon melt 10. Note that the guide portion 70 may have a shape with a sharp angle unlike in FIG. 7.

The silicon single crystal pulling furnace 100 may have the control unit 80, and the control unit 80 controls the lifting and rotating mechanism 21, the pulling portion 50, and the gas supply 60, and the measurement unit 81, thus the pulling condition values described above can be controlled.

The measurement unit 81 performs measurement of the gas concentration of the dopant gas containing the n-type dopant as a constituent element by infrared spectroscopy or mass spectrometry as described above. The measurement unit 81 preferably uses a mass spectrometer; for example, a quadrupole mass spectrometer (QMS) can be used. This allows for fast separation of a large volume of gas and makes it possible to reduce the size of the apparatus. Alternatively, an infrared spectrometer may be used. The measurement unit is preferably provided to be connected to a pipe upstream of the valve 42. Although not shown, the gas analyzed by the measurement unit 81 can be recovered between the valve 42 and the pump 43.

Further, although not shown in FIG. 7, the silicon single crystal pulling furnace 100 may have a heater, a magnetic field supply unit, and the like which are conventionally known.

Preferably, in the pulling step, the ratio of v/G is preferably controlled to for example around 0.22 to 0.27, where the growth rate of the ingot 1 is v [mm/min] and the temperature gradient from the melting point to 1350° C. during single crystal growth of the ingot 1 is G [° C./mm]. When v/G exceeds this range, COPs and voids are easily formed, and when the ratio is lower than this range, dislocation clusters are easily formed.

Further, in the pulling step, nitrogen doping is preferably performed at a nitrogen concentration of $2 \times 10^{13}$ [atoms/cm$^3$] or more and $1 \times 10^{15}$ [atoms/cm$^3$] or less into the furnace. Further, in the pulling step, it is also preferred to perform hydrogen doping by adding hydrogen gas into the furnace at 3% or more and 8% or less relative to the Ar gas. At this point of time, v/G gradient pulling is performed (more specifically, for the entire length in the crystal growth direction, the pulling rate is varied in a V shape or a W shape) under conditions where doping with nitrogen or hydrogen is not performed, to determine a v/G range within which COPs or voids, and dislocation clusters are not formed. Doping with nitrogen or hydrogen is preferably performed at v/G within the above range.

Moreover, the range of the concentration of interstitial oxygen Oi [Oi] in the ingot 1 is preferably [Oi]≤$6 \times 10^{17}$ [atoms/cm$^3$] (ASTM F-121 (1979), the same hereinafter), more preferably [Oi]≤$4 \times 10^{17}$ [atoms/cm$^3$], particularly preferably [Oi]≤$1 \times 10^{17}$ [atoms/cm$^3$]. Within a range of [Oi]≤$6 \times 10^{17}$ [atoms/cm$^3$], donors originated from oxygen and nitrogen are not formed. Further, when the range is [Oi]≤$4 \times 10^{17}$ [atoms/cm$^3$], no oxygen precipitate is detected by infrared tomography (detection limit size: equal to or less than 25 nm) in an as-grown state and after heat treatment for marking oxygen precipitate (780° C. for 3 h, additionally 1000° C. for 16 h, O$_2$ atmosphere). Moreover, when the range is [Oi]≤$1 \times 10^{17}$ [atoms/cm$^3$], no oxygen precipitate is detected even by reactive ion etching (RIE)(detection limit size: 5 nm to 7 nm) in an as-grown state and after heat treatment for marking oxygen precipitate (780° C./3 h, additionally 1000° C./16 h. O$_2$ atmosphere). The interstitial oxygen concentration can be controlled by adjusting the rotation speed of the crucible 20.

(Silicon Single Crystal Ingot)

A silicon single crystal ingot having a resistivity in a range of 10 Ω·cm or more and 1000 Ω·cm or less, and a crystal diameter of 200 mm or more, 40% or more of which ingot has a resistivity in a range of ±17% of a specification resistivity in the crystal growth direction of the silicon single crystal ingot can be produced using Sb or As as an n-type dopant in accordance with the production method of the above embodiment. A high resistance n-type silicon single crystal ingot with small tolerance margin on resistivity in the crystal growth direction, which is suitably used in a power device can be obtained. Note that the resistivity involves the resistivity of only the straight trunk of the ingot excluding a neck portion, a crown portion, and a tail portion of the ingot which do not constitute a product.

Further, the resistivity can be 50 Ω·cm or more. Moreover, the crystal diameter can be 300 mm or more. The resistivity of 40% or more of the silicon single crystal ingot may be in a range of ±7% of the specification resistivity in the crystal growth direction.

EXAMPLE

Next, in order to clarify the effects of this disclosure, an example is given below; however, this disclosure is not limited to the following example in any way.

A silicon single crystal ingot using Sb as an n-type dopant was prepared according to the procedures <1> to <10> of the above-described inter-batch control method.

<1> Seven test ingots were grown by fixing the pulling rate to the average puling rate of the ingot 1 to be actually pulled up (the dash dot dot line in FIG. 9), also fixing the Ar flow volume and the gap G to fixed standard values for the CZ furnace to be used, and changing the furnace pressure as illustrated in FIG. 9. The dopant concentration of each test ingot was determined. The furnace pressure was 10 Torr, 15 Torr, 20 Torr, 25 Torr, 30 Torr, 40 Torr, and 100.

Note that the initial Sb dopant concentration in the melt and the evaporation rate were set so that the dopant concentration in the silicon melt and the dopant concentration in the test ingot were fixed when the furnace pressure was 20 Torr and the target resistance was 50 Ω·cm under the growth conditions in Table 1 given above. Accordingly, the average pulling rate was 1.0 [mm/min], the dopant concentration in the melt was $4.1 \times 10^{15}$ [atoms/cm$^3$], and the evaporation rate was $2.01 \times 10^{15}$ [atoms/s].

Figure 10:
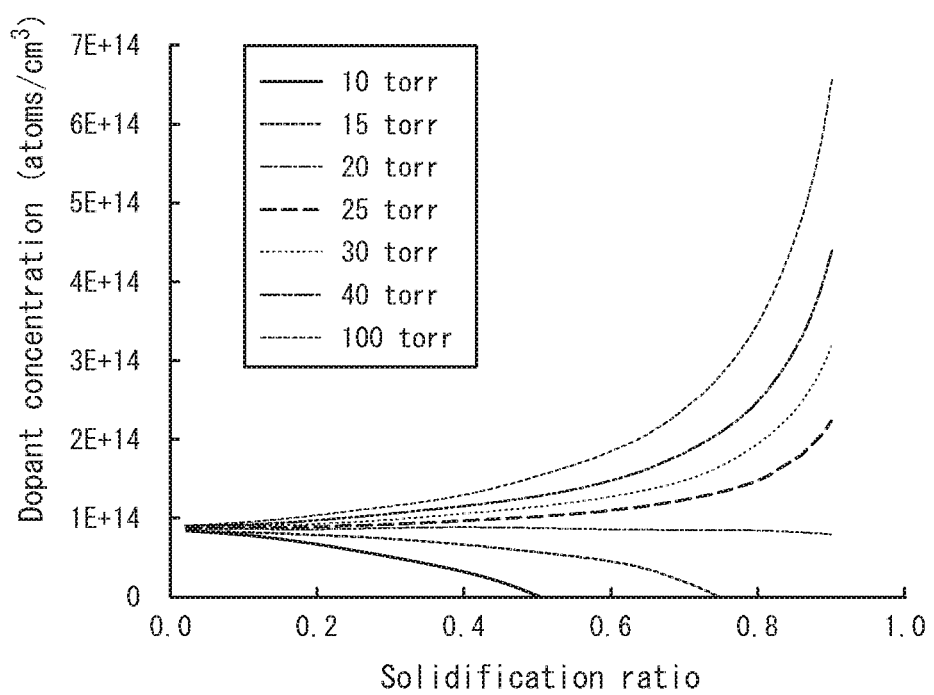
FIG. 10 is a graph illustrating the relationship between the furnace pressure and the Sb concentration of the crystal in a pre-test of Example.

<2> The dopant concentration $C_S(f_s)$ of each test ingot was determined as a function of the solidification ratio from the resistivity $C_S(f_s)$ of each test ingot in the crystal growth direction ($f_s$: solidification ratio). The results are given in FIG. 10.

<3> The dopant concentration $C_L(f_s)$ in the silicon melt was found as a function of the solidification ratio from the relation of segregation ($C_S(f_s)=k_0 C_L(f_s)$, $k_0$: the equilibrium segregation coefficient of the case where no evaporation had occurred).

<4> Further, the evaporation amount per unit solidification ratio $dC_V(f_s)$ was determined as a function of the solidification ratio from the dopant concentration in the melt without evaporation: $C_L^0(f_s)=C_0(1-f_s)^{ke-1}$ where the initial dopant concentration in the melt was $C_0$ and the dopant concentration in the silicon melt $C_L(f_s)$ found in <3> above.

Figure 11A:
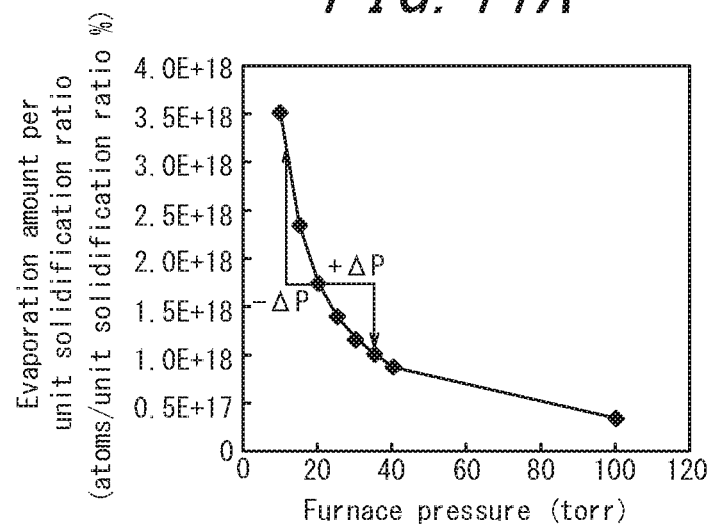
FIG. 11A is a graph depicting the relationship between a pulling condition value and the Sb evaporation amount per unit solidification ratio, relative to the furnace pressure in the pre-test in Example.

<5> The evaporation amount $dC_V(f_s)$ was averaged, and the relation between the averaged evaporation amount per unit solidification ratio and the furnace pressure was determined as depicted in FIG. 11A.

Figure 11B:
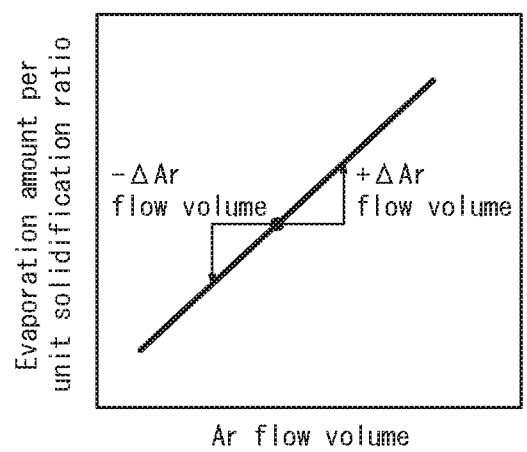
FIG. 11B is a graph depicting the relationship between pulling condition value and the Sb evaporation amount per unit solidification ratio, relative to the Ar flow volume in the pre-test in Example.

<6> In a similar manner, a plurality of evaluation ingots were grown by fixing the pulling rate to the average puling rate of the ingot 1 to be actually pulled up, fixing the furnace pressure and the gap to standard values for the CZ furnace to be used, and changing the Ar flow volume. Further, the procedures of <2> to <5> were performed to determine the relation between the average evaporation amount per unit solidification ratio and the Ar flow volume. The relation is illustrated in the schematic view of FIG. 11B.

Figure 11C:
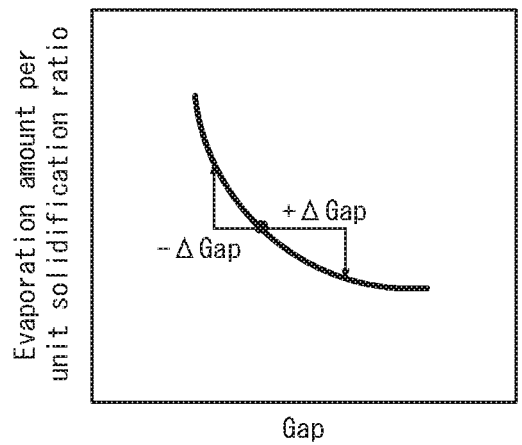
FIG. 11C is a graph depicting the relationship between pulling condition value and the Sb evaporation amount per unit solidification ratio, relative to the gap in the pre-test in Example.

<7> In a similar manner, a plurality of crystals were grown by fixing the pulling rate to the average puling rate of the ingot 1 to be actually pulled up, fixing the furnace pressure and the Ar flow volume to standard values for the CZ furnace to be used, and changing the gap G. Further, the procedures of <2> to <5> were performed to determine the relation between the average evaporation amount per unit solidification ratio and the gap G. The relation is illustrated in the schematic view of FIG. 11C.

Figure 12:
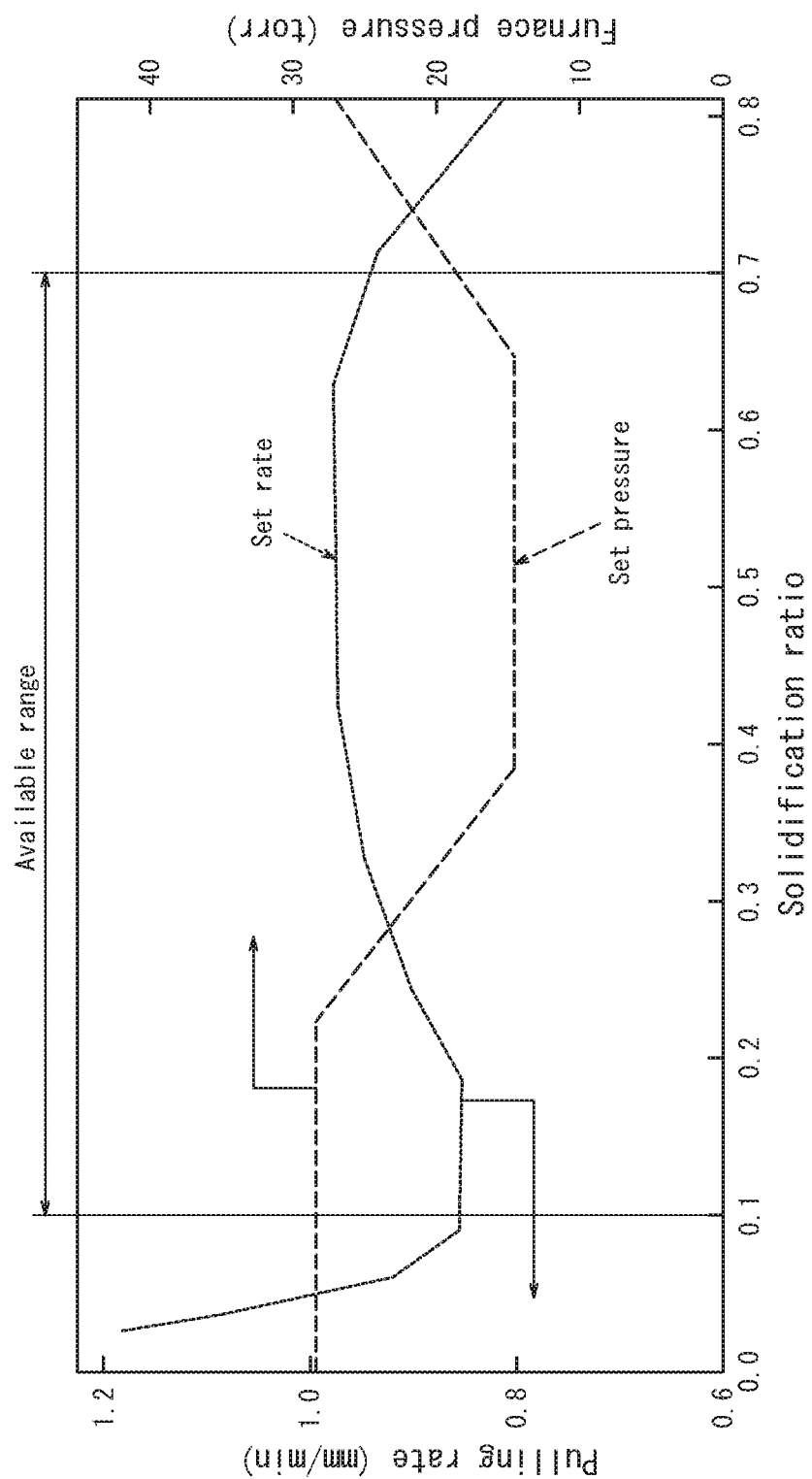
FIG. 12 is a graph illustrating a program used in Example, in which the pulling rate and the furnace pressure are set as functions of the solidification ratio.

<8> Using the relationship between the average evaporation amount per unit solidification ratio and the furnace pressure (FIG. 11A), the relation between the average evaporation amount per unit solidification ratio and the Ar flow rate (FIG. 11B), and the relation between the average evaporation amount per unit solidification ratio and the gap G (FIG. 11C), described above; a program for the furnace pressure as a function of the solidification ratio, corresponding to a program for the pulling rate as a function of the solidification ratio of the ingot 1 to be actually pulled was created as depicted in FIG. 12. The program was set to the control unit 80 of the silicon single crystal pulling furnace 100.

<9> The pulling rate program and the furnace pressure program that had been set were used to perform pulling of the ingot 1.

Figure 1:
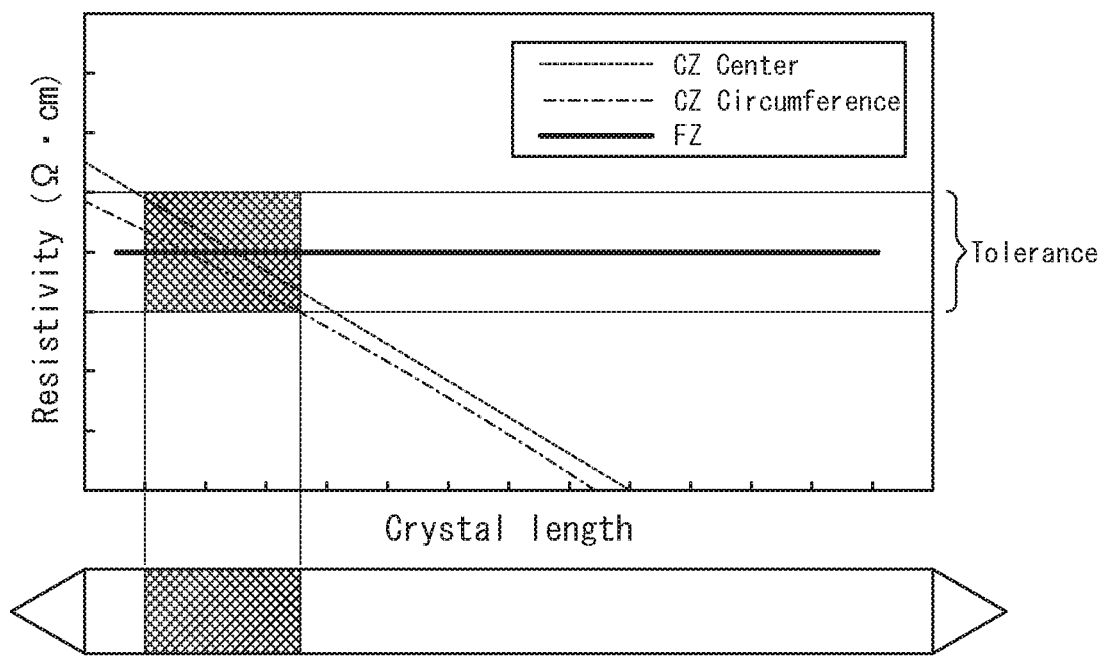
FIG. 1 is a schematic view illustrating changes and tolerance margin in the resistivity of silicon single crystal ingots obtained by the CZ process and the FZ process according to conventional techniques.
Figure 2:
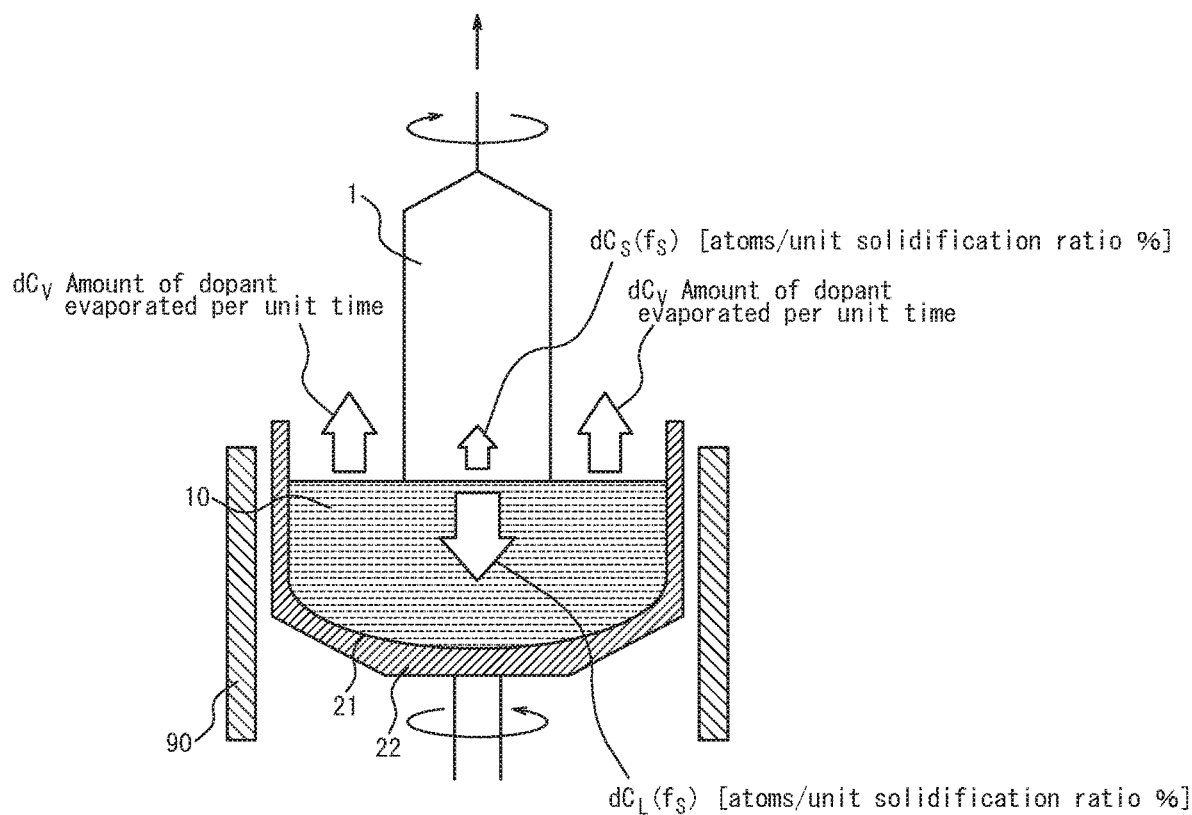
FIG. 2 is a schematic view illustrating the evaporation amount of an n-type dopant in a CZ furnace according our studies.
Figure 13:
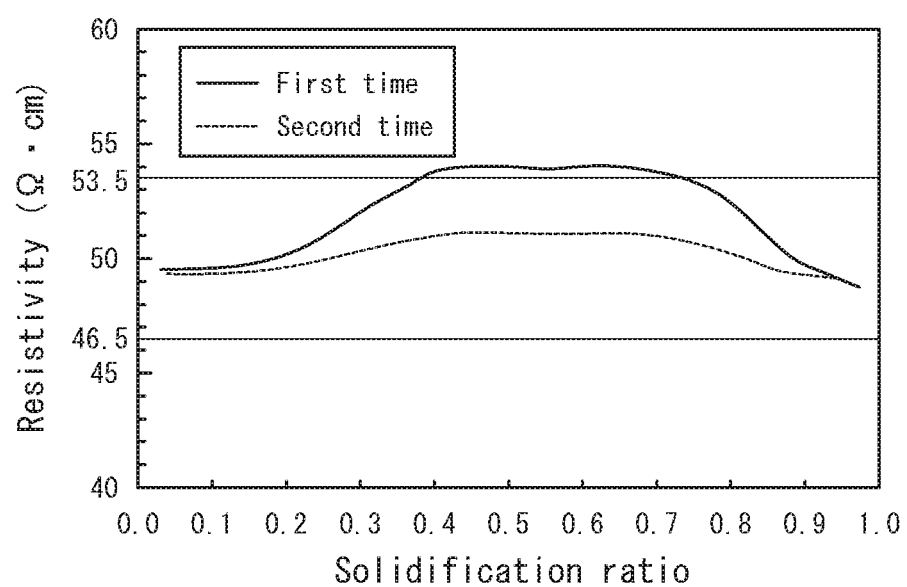
FIG. 13 is a graph illustrating the distribution of the resistivity of a silicon single crystal ingot prepared in Example in the crystal growth direction.

<10> The resistivity distribution of the ingot 1 after pulling (first time) is given in FIG. 13. Based on FIG. 1, although the tolerance margin was significantly improved compared with conventional tolerance margin, the resistivity was in disagreement with the desired resistivity tolerance margin (50 [Ω·cm]±7%). Accordingly, a more accurate program with respect to the pressure, the Ar flow volume, and the gap was reset using the furnace pressure as a main operational parameter and using the Ar flow volume and the gap G as operational parameters for fine adjustment. When this program was applied to pulling of the next batch (second time), it was found that the dopant evaporation was controlled with higher accuracy, and the resistivity was controlled within the target tolerance margin. For the first batch, approximately 50% of the ingot was found to have a resistivity in a range of approximately ±7% of the specification resistivity in the crystal growth direction, and for the second batch, 100% of (the entire) ingot was found to have a resistivity in a range of ±7% of the specification resistivity in the crystal growth direction.

INDUSTRIAL APPLICABILITY

This disclosure can provide a method of producing a high resistance n-type silicon single crystal ingot with small tolerance margin on resistivity in the crystal growth direction, which is suitably used in a power device.

REFERENCE SIGNS LIST

1 Silicon single crystal ingot
10 Silicon melt
20 Crucible
30 Chamber
40 Pressure regulator portion
50 Pulling portion
60 Ar gas supply
70 Guide portion
80 Control unit
81 Measurement unit

The invention claimed is:

1. A method of producing a silicon single crystal ingot using a silicon crystal-pulling furnace having:
   a crucible storing a silicon melt doped with an n-type dopant made of Sb or As,
   a chamber accommodating the crucible,
   a pressure regulator portion controlling a pressure in the chamber,
   a pulling portion pulling up a silicon single crystal ingot from the silicon melt,
   a gas supply for supplying Ar gas into the chamber, and
   a guide portion provided above a surface of the silicon melt for guiding the Ar gas to flow along the surface of the silicon melt, the method comprising:
      pulling up the silicon single crystal ingot by the Czochralski process; and
      controlling an evaporation amount by keeping an amount of the n-type dopant being evaporated from the silicon melt per unit solidification ratio within a target evaporation amount range per unit solidification ratio by controlling one or more pulling condition values including at least one of a pressure in the chamber, a flow volume of the Ar gas, and a gap between the guide portion and the silicon melt while performing the pulling up the silicon single crystal ingot by the Czochralski process.

2. The method of producing a silicon single crystal ingot according to claim 1, wherein the target evaporation amount per unit solidification ratio is uniform in a crystal growth direction.

3. The method of producing a silicon single crystal ingot according to claim 2, further comprising:
   prior to the pulling up the silicon single crystal ingot by the Czochralski process:
   forming one or more silicon single crystal ingots for evaluation using the silicon single crystal pulling furnace; and
   determining changes in the amount of the n-type dopant being evaporated per unit solidification ratio in the silicon single crystal pulling furnace, based on changes in a resistivity of the silicon single crystal ingots for evaporation in a crystal growth direction,
   wherein in the controlling the evaporation amount, the pulling condition values are increased or decreased based on the determined changes in the evaporation amount per unit solidification ratio.

4. The method of producing a silicon single crystal ingot according to claim 2, further comprising measuring the evaporation amount of the n-type dopant per unit solidification ratio while performing the pulling up the silicon single crystal ingot by the Czochralski process
   wherein in the controlling the evaporation amount, the pulling condition values are controlled so that the measured evaporation amount per unit solidification ratio is kept within the target evaporation amount per unit solidification ratio.

5. The method of producing a silicon single crystal ingot according to claim 4, wherein in the measuring the evaporation amount of the n-type dopant per unit solidification ratio, a concentration of the n-type dopant discharged with the Ar gas on an Ar gas outlet side is measured.

6. The method of producing a silicon single crystal ingot according to claim 5, wherein in the measuring the evaporation amount of the n-type dopant per unit solidification ratio, a diameter and a pulling length of the silicon single crystal ingot being pulled up are measured, and the evaporation amount per unit solidification ratio is calculated on the basis of the solidification ratio based on:

the measurement of the diameter and the pulling length of the silicon single crystal ingot being pulled up, and the concentration of the n-type dopant contained in the Ar gas.

7. The method of producing a silicon single crystal ingot according to claim 1, further comprising:

prior to the pulling up the silicon single crystal ingot by the Czochralski process:

forming one or more silicon single crystal ingots for evaluation using the silicon single crystal pulling furnace; and determining changes in the amount of the n-type dopant being evaporated per unit solidification ratio in the silicon single crystal pulling furnace, based on changes in a resistivity of the silicon single crystal ingots for evaluation in a crystal growth direction, wherein in the controlling the evaporation amount, the pulling condition values are increased or decreased based on the determined changes in the evaporation amount per unit solidification ratio.

8. The method of producing a silicon single crystal ingot according to claim 1, further comprising measuring the evaporation amount of the n-type dopant per unit solidification ratio while performing the pulling up the silicon single crystal ingot by the Czochralski process, wherein in the controlling the evaporation amount, the pulling condition values are controlled so that the measured evaporation amount per unit solidification ratio is kept within the target evaporation amount per unit solidification ratio.

9. The method of producing a silicon single crystal ingot according to claim 8, wherein in the measuring the evaporation amount of the n-type dopant per unit solidification ratio, a concentration of the n-type dopant discharged with the Ar gas on an Ar gas outlet side is measured.

10. The method of producing a silicon single crystal ingot according to claim 9, wherein in the measuring the evaporation amount of the n-type dopant per unit solidification ratio, a diameter and a pulling length of the silicon single crystal ingot being pulled up are measured, and the evaporation amount per unit solidification ratio is calculated on the basis of the solidification ratio based on:

the measurement of the diameter and the pulling length of the silicon single crystal ingot being pulled up, and the concentration of the n-type dopant contained in the Ar gas.

\* \* \* \* \*